United States Patent [19]

Maniwa et al.

[11] Patent Number: 5,218,761
[45] Date of Patent: Jun. 15, 1993

[54] PROCESS FOR MANUFACTURING PRINTED WIRING BOARDS

[75] Inventors: Ryo Maniwa; Hidebumi Ohnuki, both of Tokyo, Japan

[73] Assignee: NEC Corporation, Tokyo, Japan

[21] Appl. No.: 865,215

[22] Filed: Apr. 8, 1992

[30] Foreign Application Priority Data

Apr. 8, 1991 [JP] Japan .................................. 3-073456

[51] Int. Cl.$^5$ .............................................. H05K 3/10
[52] U.S. Cl. ...................................... 29/852; 156/901; 174/266; 428/901
[58] Field of Search .......................... 29/852; 156/901; 174/266; 428/901

[56] References Cited

U.S. PATENT DOCUMENTS

| | | | |
|---|---|---|---|
| 3,672,986 | 6/1972 | Schneble, Jr. et al. | 156/901 X |
| 3,691,632 | 9/1972 | Smith | 174/266 X |
| 4,211,603 | 7/1980 | Reed | 29/852 X |
| 4,389,278 | 6/1983 | Kai | 29/852 X |
| 4,525,246 | 6/1985 | Needham | 29/852 |

FOREIGN PATENT DOCUMENTS

| | | | |
|---|---|---|---|
| 1207631 | 10/1970 | United Kingdom. | |
| 1212362 | 11/1970 | United Kingdom. | |
| 1303851 | 1/1973 | United Kingdom | 174/266 |
| 1396481 | 6/1975 | United Kingdom | 29/852 |
| 1441526 | 7/1976 | United Kingdom | 179/266 |

Primary Examiner—Carl J. Arbes

[57] ABSTRACT

A laminated board in which each of prepreg sheets is sandwiched between an internal printed wiring board which is provided with wirings and each of external printed wiring board which is provided with wirings on the outermost surface thereof is formed with through-holes by drilling. A thin copper plating layer is formed on the surfaces of the laminated board including the inner wall of the through-hole. Then, an alkali-soluble photoresist film is selectively formed on the surface of the thin copper plating layer and a thick copper plating layer is formed. The thin copper plating layer is removed by using the thick copper plating layer as a mask to forme through holes and wirings. The through holes and wirings can be thus formed without using the additive process. Environmental pollution due to use of organic solvents can be prevented by avoiding the use of an organic solvent-soluble resist film having a strong resistance to alkalis.

8 Claims, 2 Drawing Sheets

PROCESS FOR MANUFACTURING PRINTED WIRING BOARDS

BACKGROUND OF THE INVENTION

1. Field of the Invention

The present invention relates to a process for manufacturing a printed wiring board and in particular to a process for manufacturing a multilayer printed wiring board.

2. Prior Art

A multilayer printed wiring board has found in variety of electronic equipment, such as computers, electronic switching system or the like.

Prior art process for manufacturing a multilayer printed wiring board comprises the steps of: disposing an internal printed wiring board comprising an insulating plate and circuit patterns provided on one or both surfaces thereof and prepreg sheets so that the internal printed wiring board is sandwiched between the prepreg sheets; disposing external boards having a copper foil on the outermost surface thereof so that the internal printed wiring board and prepreg sheets are sandwiched between the external printed wiring boards; bonding resulting structure under pressure; forming through-holes through the resulting laminated structure; then forming through holes or copper plated-through hole and circuit patterns for external boards by using the tenting process or the additive process, etc.; and thereafter performing application of a solder resist film and finish treatment.

There has been a demand to avoid the use of organic solvents in the process for manufacturing printed wiring boards in order to preserve global environment.

However, a resist film which is soluble to organic solvents has to be used as an additive mask since used additive plating liquid is highly alkaline in the prior art process for manufacturing printed wiring boards. There has been a problem that an organic solvent is required in the manufacturing process.

SUMMARY OF THE INVENTION

It is, therefore, an object of the present invention to provide a process for manufacturing a printed wiring board which requires no organic solvent.

In order to accomplish the above mentioned object, the present invention provides a process for manufacturing a printed wiring board, comprising the steps of: forming a laminated board by laminating an internal printed wiring board which is provided with wirings, external printed wiring boards which are provided with wirings on at least the outermost surfaces thereof and prepreg sheets so that each of the prepreg sheets is sandwiched between the internal printed wiring board and each of the external printed wiring boards; selectively providing the laminated board with through-holes therethrough and forming a first copper plating layer on the surfaces of the laminated board including the inner walls of the through-holes; selectively forming an alkali-soluble photoresist film on the first copper plating layer; forming a second copper plating layer thickner in a thickness than the first copper plating layer on the first copper plating layer by using the photoresist film as a mask; removing the photoresist film with an alkaline solution; and removing the exposed first copper plating layer by etching back the whole surface of the laminated board to form through holes while leaving the first and second copper plating layers in at least the through-holes.

DESCRIPTION OF THE PREFERRED EMBODIMENTS

The present invention will be described in more detail with reference to drawings.

Referring now to FIGS. 1A to 1H, there are shown sectional views of the successive steps in the process for manufacturing a multilayer printed wiring board according to a first embodiment of the present invention.

Figure 1A:
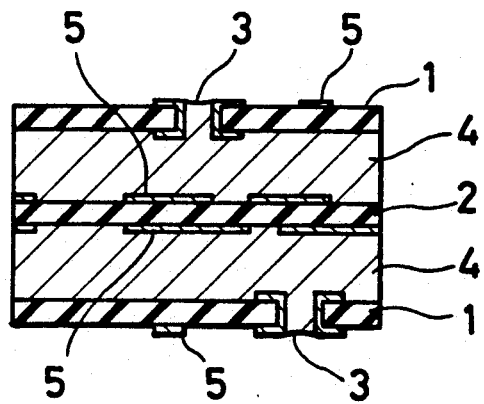
FIGS. 1A to 1H are sectional views of the successive steps in the process for manufacturing a multilayer printed wiring board according to one embodiment of the present invention.

Each of prepreg sheets 4 is sandwiched between an internal printed wiring board 2 which is provided with wirings 5 on both surfaces thereof and each of external printed wiring boards 1 which is provided with wirings 5 and through holes 3 on an outermost layer thereof as shown in FIG. 1A. They are laminated and bonded under pressure to each other to form a laminated board.

Each of the internal and external wiring boards 2 and 1 comprises a glass epoxy substrate having a thickness of 0.1 mm and copper layers having thicknesses of 18 $\mu$m and 70 $\mu$m thereon, which serve as signal wiring and power source or ground wiring respectively.

Figure 1B:
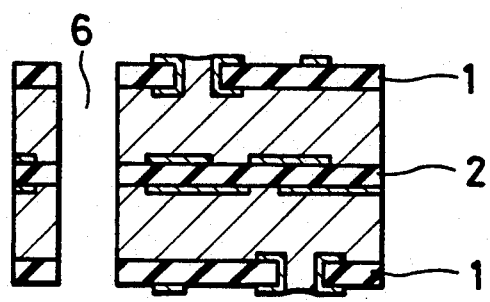

The resulting laminated board is then drilled at desired position to form an interlayer connecting hole or through-hole 6 having a diameter of 0.8 mm therethrough as shown in FIG. 1B.

Figure 1C:
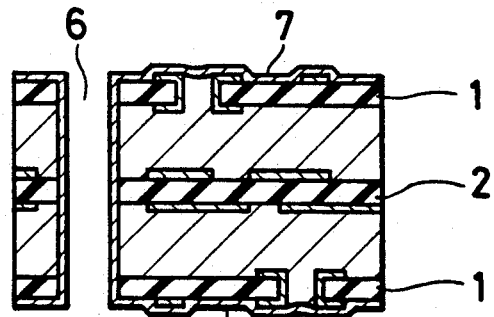

Thereafter, the surfaces of the laminated board including the inner walls of the through-hole 6 is subjected to electroless plating to form a thin copper plating layer (for example, having a thickness of 0.5 to 1 $\mu$m) and then the surface of the thin copper layer is subjected to electroplating to form a copper plating layer 7 having a thickness of 1 to 3 $\mu$m as shown in FIG. 1C.

Figure 1D:
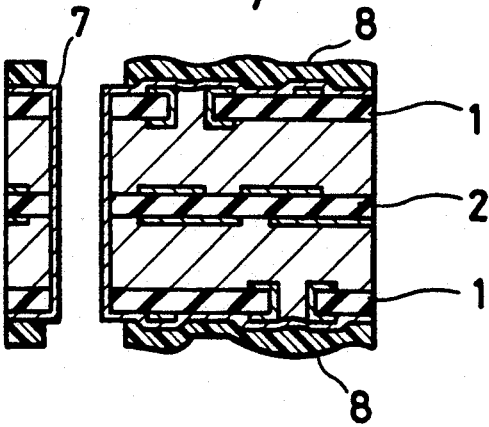
Figure 1E:
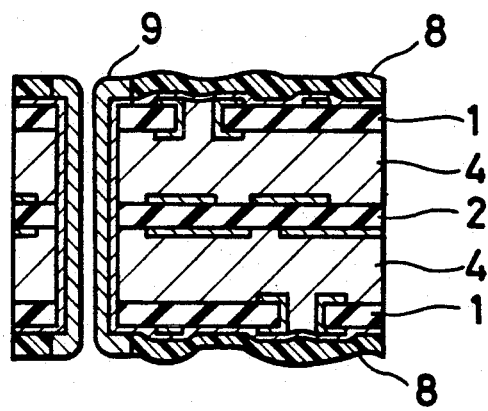

An alkali-soluble photoresist film 8 is applied to the plated laminated board to form such a pattern that the copper plating layer 7 is selectively exposed on the inner wall of the through-hole 6 and on the surfaces of the laminated board which is located in the vicinity of the both ends of the through-hole 6 as shown in FIG. 1D.

The surface of the exposed copper plating layer 7 is subjected to electroplating by using the photoresist film 8 as a mask to form a thick copper plating layer 9 having a thickness of 35 $\mu$m.

Figure 1F:
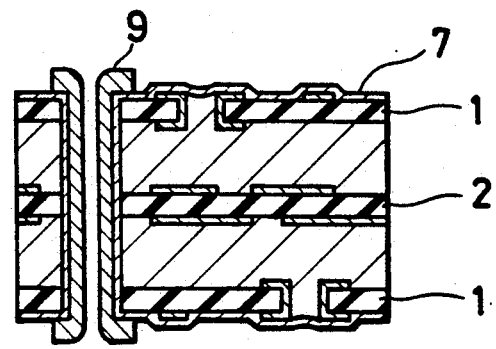

The photoresist film 8 is removed with an aqueous solution of about 10% NaOH as shown in FIG. 1F.

Figure 1G:
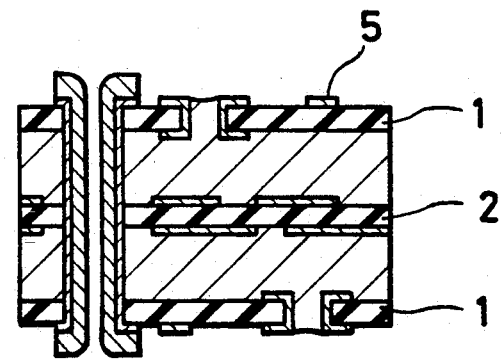

The thus exposed copper plating layer 7 on which the copper plating layer 9 is not formed and the copper plating layer 9 are etched back to a depth of 2 to 5 $\mu$m below the surfaces thereof with an etching solution which is a mixture of sulfuric acid and hydrogen peroxide water to remove the exposed portion of the copper plating layers 7, as shown in FIG. 1G. The through hole or copper plated-through hole is thus provided.

Figure 1H:
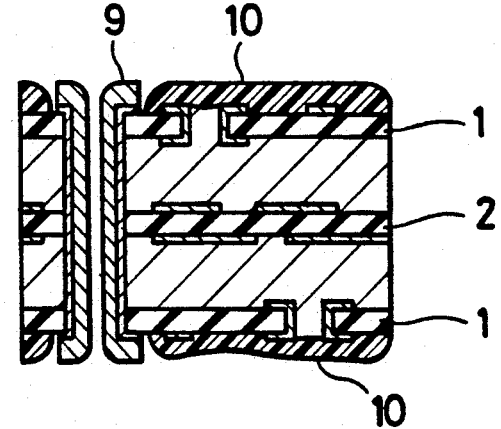

A solder resist film 10 is selectively formed on the surfaces of the laminated board as shown in FIG. 1H to give a multilayer printed wiring board.

Incidentally, the current capacity of the wiring can be increased by selectively exposing the surface of the copper plating layer 7 which is formed and located on the wiring 5 of the external printed wiring board 1 when the photoresist film 8 is patterned and then by forming a thick copper plating layer (for example, having the same thickness as the copper plating layer 9) on the exposed portion to increase the thickness of the wiring 5 of the external printed wiring board 1.

As discussed above, according to the present invention, the through holes and the wirings are formed by using the copper plating layer which is obtained according to only the electroplating method (without using the additive process). For this reason, it is possible to use an alkali-soluble photoresist film in the step of forming the through holes and the wirings of the external wiring boards. Thus, according to the present invention, it is possible to prevent the environment from being polluted by avoiding use of an organic solvent related with adopting the additive process.

In the prior art, drilling fabrication has been generally performed to form through-holes which have no metal plating layer and are used as holes for mounting parts. In contrast to the art, according to the presennt invention, mounting holes having a higher positional precision can be also formed by drilling a laminated board simultaneously with forming of through holes and thereafter by removing thin plated layers.

What is claimed is:

1. A process for manufacturing a printed wiring board, comprising the steps of:
    forming a laminated board by laminating an internal printed wiring board which is provided with wiring on both surfaces thereof to external printed wiring boards which are provided with wiring on both surfaces thereof, first through-holes which are provided through said external printed wiring boards and prepreg sheets which are sandwiched between said internal printed wiring board and each of said external printed wiring boards so that said first through-holes are filled with the prepreg;
    selectively providing said laminated board with second through-holes therethrough which are formed at positions not superposed on said first through-holes;
    forming a first copper plating layer by a first electroless plating step on the surfaces of said laminated board which include the inner faces of said second through-holes, surfaces of the outer layers of said laminated board and surfaces of the prepreg filled in the first through-holes, respectively;
    selectively forming an alkali-soluble photoresist film on said first copper plating layer;
    forming by a second electroless plating step, a second copper plating layer thicker than said first copper plating layer selectively covered by said alkaline-soluble photoresist film as a mask;
    removing said photoresist film with an alkaline solution to expose said first copper plating layer; and
    removing the thus exposed first copper plating layer by etching back to expose said wiring on the surface of said laminated board; and forming on said exposed wiring a solder resist film which remains as the final product.

2. The process for manufacturing a printed wiring board as defined in claim 1 in which said internal and external wiring board comprises a glass epoxy substrate having a thickness of a 0.1 mm and conductive layers having thicknesses of 18 $\mu$m and 70 $\mu$m thereon, which serve as a signal wiring and a power source or ground wiring, respectively.

3. The process for manufacturing a printed wiring board as defined in claim 2 in which said conductive layers are composed of copper.

4. The process for manufacturing a printed wiring board as defined in claim 1 in which said through-hole is formed by means of drilling and has a diameter of 0.8 mm.

5. The process for manufacturing a printed wiring board as defined in claim 1 in which said first copper plating layer comprises a thin copper plating layer 0.5 to 1 $\mu$m thick which is formed by an electroless plating and an another copper plating layer 1 to 3 $\mu$m thick which is formed on the surface of said thin copper plating layer by an electroplating.

6. The process for manufacturing a printed wiring board as defined in claim 1 in which said second copper plating layer is formed by an electroplating and has a thickness of 35 $\mu$m.

7. The process for manufacturing a printed wiring board as defined in claim 1 in which said alkaline solution comprises about 10% NaOH.

8. The process for manufacturing a printed wiring board as defined in claim 1 in which said exposed first copper plating layer and said second copper plating layer are etched back to a depth of 2 to 5 $\mu$m below the surfaces thereof with a mixed etching solution comprising sulfuric acid and hydrogen peroxide water.

* * * * *